United States Patent
Hackler, Sr. et al.

(10) Patent No.: US 7,518,189 B1
(45) Date of Patent: Apr. 14, 2009

(54) INDEPENDENTLY-DOUBLE-GATED FIELD EFFECT TRANSISTOR

(75) Inventors: Douglas R. Hackler, Sr., Boise, ID (US); Stephen A. Parke, Nampa, ID (US)

(73) Assignee: American Semiconductor, Inc., Boise, ID (US)

( * ) Notice: Subject to any disclaimer, the term of this patent is extended or adjusted under 35 U.S.C. 154(b) by 256 days.

(21) Appl. No.: 11/307,863

(22) Filed: Feb. 25, 2006

Related U.S. Application Data

(63) Continuation-in-part of application No. 10/613,169, filed on Jul. 3, 2003, now Pat. No. 7,015,547.

(51) Int. Cl.
*H01L 29/94* (2006.01)
(52) U.S. Cl. .................. 257/347; 257/134
(58) Field of Classification Search ............... 257/347, 257/349, 134, 256, 262
See application file for complete search history.

(56) References Cited

U.S. PATENT DOCUMENTS

| | | | | |
|---|---|---|---|---|
| 5,543,643 A | | 8/1996 | Kapoor | 257/262 |
| 5,631,176 A | | 5/1997 | Kapoor | 438/195 |
| 6,163,052 A | | 12/2000 | Liu et al. | 257/334 |
| 6,580,137 B2 * | | 6/2003 | Parke | 257/401 |
| 6,956,263 B1 * | | 10/2005 | Mistry | 257/330 |
| 7,061,050 B2 * | | 6/2006 | Fazan et al. | 257/348 |
| 2005/0146942 A1 * | | 7/2005 | Madurawe | 365/189.05 |

OTHER PUBLICATIONS

Balasubramanian, et al., "Sub-10 nm Transistors: Ultra Thin Body Back-Gated Accumulation Mode FET," Dept. of Electrical Engineering & Computer Sciences, Univ. of Calif., Berkeley; 2004 EECS Research Summary, Chapter 10; [online], [retrieved on Feb. 20, 2006]. Retrieved from the Internet <URL: http://buffy.eecs.berkeley.edu/PHP/resabs.php?f_year=2004&f_submit=one&f_absid=100386>.

* cited by examiner

*Primary Examiner*—Phat X Cao
(74) *Attorney, Agent, or Firm*—Your Intellectual Property Matters, LLC; Robert A. Frohwerk

(57) ABSTRACT

This independent double-gated transistor architecture creates a MOSFET, JFET or MESFET in parallel with a JFET. Its two gates may be configured to provide a four-terminal device for independent gate control, a floating gate device, and a double-gate device. First and second insulating spacers are disposed on opposing sides of the top gate with the first spacer between the source and the top gate and the second spacer between the drain and the top gate. Source and drain extensions extend proximate to the spacers and couple to the channel. The spacers shield the channel from the field effect of the source and drain and further resist compression of the channel by the source and drain. Truly independent control of the two gates makes possible many 2-, 3- and 4-terminal device configurations that may be dynamically reconfigured to trade off speed against power. The resulting transistors exhibit inherent radiation tolerance.

29 Claims, 9 Drawing Sheets

Single-Gated SG

Double-Gated DG

Independently-Double-Gated IDG

INDEPENDENTLY-DOUBLE-GATED FIELD EFFECT TRANSISTOR

CROSS-REFERENCES TO RELATED APPLICATIONS

This application is a Continuation-In-Part of U.S. patent application Ser. No. 10/613,169 filed Jul. 3, 2003, entitled "Multi-Configurable Independently Double-Gated MOS-FET," which is incorporated here by reference.

FIELD OF THE INVENTION

The present invention relates generally to the structure and application of field effect transistors in which current flow through a channel is controlled by more than one gate electrode. More particularly, the present invention pertains to field effect transistors in which a single channel is controlled independently by two gates, at least one of which is a junction gate.

BACKGROUND OF THE INVENTION

Circuit design engineers within the dynamic electronics industry are constantly looking for components that are smaller and more efficient. Ever-increasing device densities have been driven by demand for ever-increasingly capable products that require more and more memory to support ever more complex circuitry for ever faster process and more capable control systems.

A basic active circuit design element is the Field Effect Transistor (FET), a voltage-controlled semiconductor device in which the output current is controlled by the voltage imposed at an input gate. FETs are used effectively for a wide range of applications, from high-speed digital logic and high-power analog circuits to low current analog, Radio Frequency (RF) and mixed signal (MS) circuits. With their very high input impedance, FETs are useful for amplification and processing of very low current signals in battery-powered devices.

A FET may be configured as a three electrode device with a drain, a source, and a gate electrode, or as a multi-electrode device where two or more gate electrodes are incorporated to provide a multi-gated device. In all instances, drain and source electrodes couple to a semiconducting channel, while gate electrodes control the electron flow through the channel to provide current amplification and switching capability. The gate may be constructed in different ways to achieve different device characteristics. In a Metal Oxide Semiconductor (MOS) FET, for instance, voltage control by the gate is achieved by exerting a field effect on the channel through a thin gate oxide. FETs that use a simple pn-junction (JFET) or a direct Metal-Semiconductor (MESFET), Schottky, interface have no such oxide separating the gate from the channel. MOSFETs, in particular, are found in virtually every application of microelectronics and integrated circuits, especially in the form of Complementary MOS (CMOS) devices, which are often selected for their low power consumption.

A key concern in microelectronics is being able to generate smaller devices that consume less power. Although significant progress has been made in this area, a common problem is that the influence of gate voltage on the channel diminishes as the device decreases in size and secondary effects become more prominent. Since gate voltage control is achieved by exerting a field effect on the channel, short-channel effects become more problematic as the overall transistor size decreases, and interfere with the ability of the gate voltage to maintain exclusive control over the channel. Ideally, control of the channel should be a function only of the gate voltage.

For a general purpose transistor architecture it is advantageous to offer the ability to provide different electrical configurations and threshold voltages that can be matched to specific applications. Typically, this is achieved with additional process complexity that requires more masking steps, multiple threshold implants and perhaps multiple thicknesses of gate oxide. It would be advantageous to achieve multiple transistor configurations by manipulation of the connections of the device to result in different device characteristics in order to trade power for speed or vice versa. Fabrication would be greatly simplified if the MOS gate oxide could be eliminated and various electrical behaviors could be achieved by simply modifying connections to or within the transistor cell. It would further be advantageous to provide such configurations without a penalty to the device layout area.

For these reasons among others, it would be an advancement in the art to provide a transistor architecture that offers independent multiple gate electrodes, where the superior control of the channel can be used to render smaller, more efficient analog, digital and mixed signal circuits, and where the flexibility provided by multiple electrical configurations avoids the need for modifications to the fabrication process. Such devices are disclosed and claimed herein.

BRIEF SUMMARY OF THE INVENTION

Flexible, dynamic threshold control of analog and digital circuits is possible with Independently-Double-Gated (IDG) field effect transistors (IDGFETs). This is highly desirable for ultra-low-power (ULP) chip designs. By varying the voltage on a second control gate of an IDG transistor, the standby leakage current and static power dissipation can be dynamically reduced by several orders of magnitude. At the same time, the switching speed and the active power dissipation can be varied over a range of at least plus-or-minus 50%. With this capability, transistors can be designed for minimum size and still be used to achieve both low static power when in standby mode, and high-performance when activated. This advantage holds for all static and dynamic CMOS logic gate families as well as analog circuitry.

The present invention provides a multi-gated FET transistor architecture that offers a multi-terminal device for independent gate control without the use of a second gate oxide. By simple manipulation of the gate and local interconnect masks, the terminal connections are changed to provide different device configurations.

The architecture includes a bottom gate that may be formed of crystalline silicon and is disposed on a substrate to create a bottom junction-FET. The source, channel, and drain are disposed above the bottom gate to provide a carrier flow controlled by the bottom gate voltage. A top gate is disposed on a gate dielectric or directly on the channel to create a top MOSFET or JFET or MESFET in parallel with the bottom junction-FET, sharing the source, channel and drain with the bottom junction-FET. Insulating spacers are disposed on opposing sides of the top gate such that a first spacer is between the source and the top gate and a second spacer is between the drain and the top gate. The transistor is completely surrounded by sidewall spacers, a buried dielectric layer, and a dielectric cap layer to provide full three-dimensional isolation. This structure can be summarized as a top-gate FET self-aligned to a bottomgate JFET with a common source, drain and channel.

The unique transistor architecture has flexible terminal connection design and superior gate control. The transistors produced in accordance with the present invention have improved electron flow over conventional designs. Additional aspects and advantages of this invention will be apparent from the following detailed description of preferred embodiments, which proceeds with reference to the accompanying drawings.

BRIEF DESCRIPTION OF THE DRAWINGS

The particular features and advantages of the invention briefly described above as well as other objects will become apparent from the following description taken in conjunction with the accompanying drawings, in which.

The following Reference Numbers may be used in conjunction with one or more of the accompanying FIGS. 1-13 of the drawings:
100 Flexible FET
105 Silicon-On-Insulator (SOI) Layer
110 Buried Oxide (BOX)
115 Oxide
118 STI Insulator between Bottomgate Interconnect and Topgate
120 Bottomgate
125 Bottomgate Contact
130 Channel
140 Source
142 Source Extension
145 Undoped Region, Source
148 Source Contact
150 Drain
152 Drain Extension
155 Undoped Region, Drain
158 Drain Contact
160 Topgate
162 Topgate Dielectric (optional)
165 Topgate Contact
168 Damascene Topgate
171 Insulating Spacer between Source and Topgate
172 Insulating Spacer between Drain and Topgate
173 Insulating Spacer
174 Insulating Spacer
176 Insulating Spacer between Bottomgate and Topgate
177 Insulating Sidewall Spacer
178 Insulating Sidewall Spacer
192 Polish Stop Pad Layer, Source
194 Polish Stop Pad Layer, Drain
198 InterLayer Dielectric (ILD) layer

DETAILED DESCRIPTION OF THE INVENTION

Figure 1:
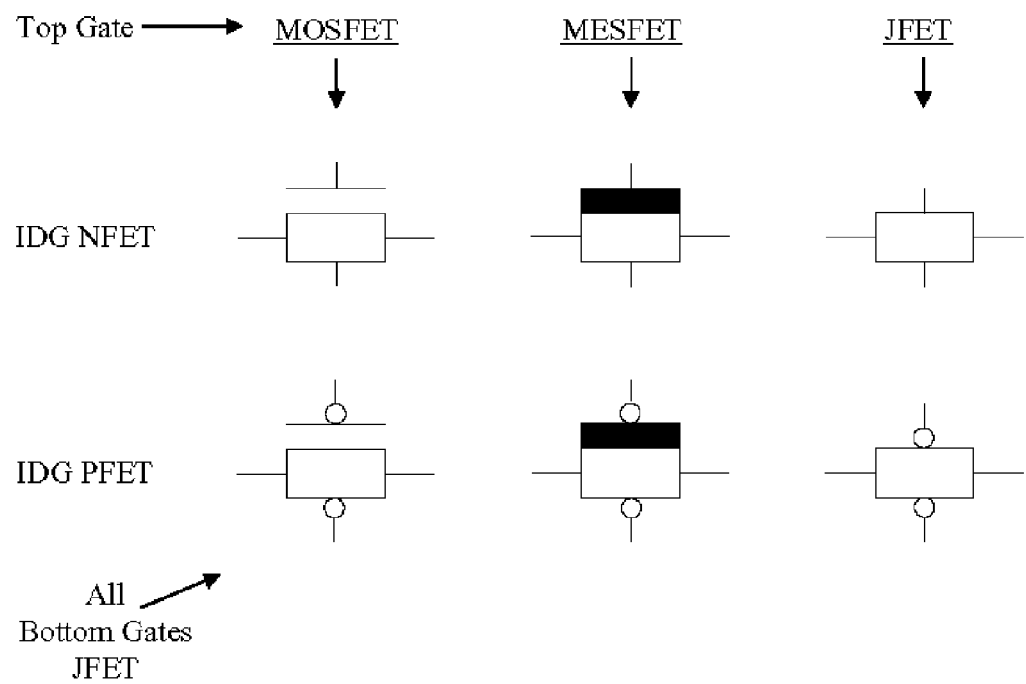
FIG. 1 shows schematic notations for a family of devices having various IDG transistor configurations with JFET Bottom Gates that can be implemented in the present invention.

A variety of independently double-gated (IDG) field effect transistors (FETs) are depicted in FIG. 1. There are three possible types of IDG FETs, having either MOSFET, MESFET, or JFET top gates.

Figure 2:
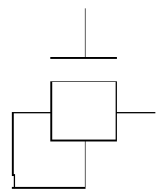
FIG. 2 is a schematic representation of a Single-Gated embodiment.
Figure 2:
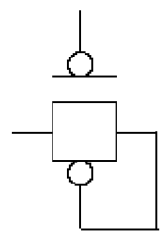
Figure 3:
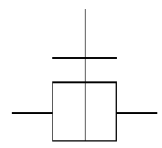
FIG. 3 is a schematic representation of a Double-Gated embodiment.
Figure 3:
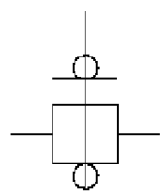
Figure 4:
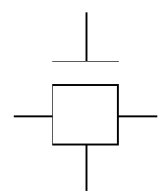
FIG. 4 is a schematic representation of a Independent Double-Gated embodiment.
Figure 4:
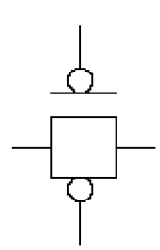

FIGS. 2-4 show schematic representations of various IDG-FET embodiments. FIG. 2 shows both n-channel and p-channel single gated (SG) versions of devices having an MOS topgate with a JFET bottomgate. In this SG configuration the bottomgate is connected to the source, or it may be left to float. The double-gated (DG) transistors of FIG. 3 have their top and bottom gates connected together, as is the case with conventional double-gated transistors. The independently double-gated (IDG) transistors of FIG. 4 are true four-terminal devices, providing independent bias to the topgate and the bottomgate. As is well known in the art, each device represented in FIGS. 2-4 has specific uses that are suitable for different applications.

Figure 5:
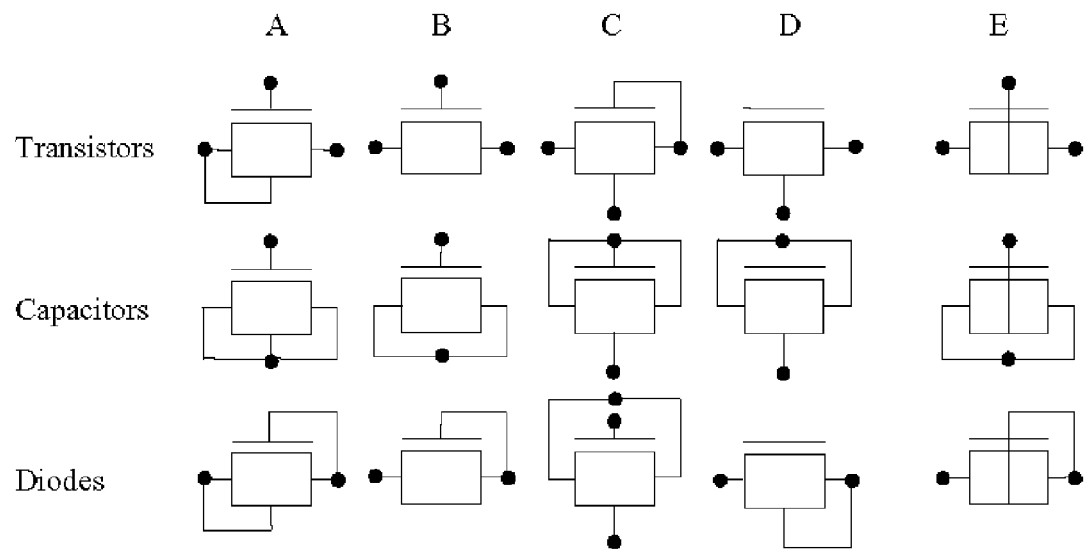
FIG. 5 depicts additional devices that may be produced within the scope of the present invention.

With the freedom to design using a true four-terminal device, any one of the fifteen 3-terminal and 2-terminal configurations shown in FIG. 5 may be produced to provide a variety of additional circuit functions. Beyond the transistors of FIGS. 1-4, a circuit designer is able not only to include the equivalent of conventional MOSFETs, MESFETs and JFETs, but also to produce various useful 3-terminal transistor types and various useful 2-terminal capacitors and diodes with varying electrical behaviors and advantages. In general, the bottom gate may either be connected to the source, to the top gate, or floated. Although the devices shown in FIG. 5 are depicted with MOSFET top gates, it will be recognized by one skilled in the art that each of these may also be implemented with either MESFET or JFET top gates.

For the discussion of 3-terminal devices, refer to the top row of FIG. 5 labeled "Transistors". The first transistor, in column A, has its bottomgate tied to its source to yield what is typically known as a single-gate (SG) MOSFET. It is noted here that although FIG. 5 shows devices having MOSFET topgates and JFET bottomgates, in most cases any of the devices shown in FIG. 1 may be substituted to produce similarly useful results. Transistor B has its bottomgate floating, which is similar to a conventional SOI (Silicon-On-Insulator) MOSFET. The transistor of column C has its topgate tied to its source, while its bottomgate remains to be used as the JFET input. The topgate of Transistor D is floating and its bottomgate behaves as the JFET input. Transistor E has its topgate tied to its bottomgate, typically known as a double-gate (DG) or dynamic threshold (DT) MOSFET.

The middle row of FIG. 5 (labeled "Capacitors") shows the first of the 2-terminal devices. All of the devices shown in this set are pre-configured by an interconnect between their source and drain. Here, capacitor A is a standard MOSCAP with its bottomgate, source, and drain all tied together as the cathode. Capacitor B is also a MOSCAP but with its bottomgate floating. The capacitor of column C is a PN junction diode and capacitor with the topgate, source and drain tied as the cathode, and the JFET bottomgate behaving as the anode. Capacitor D, like Capacitor C, is also a PN junction diode and capacitor but with the topgate floating. The remaining capacitor E is a DG MOSCAP with its top and bottom gates tied together.

The bottom row of FIG. 5 illustrates additional 2-terminal devices. The diode in column A is a diode-connected MOSFET with its topgate tied to its drain and its bottomgate tied to its source. Diode B is a diode-connected MOSFET with its topgate tied to its drain but with its bottomgate floating. Diode C, with an interconnect between its source and drain, is actually a 3-terminal device acting as a gated-diode between the bottomgate and Source/Drain (SD) terminals, with the topgate serving as the control input. Alternately, Diode C may be used as a 3-terminal variable capacitor (varactor) between the topgate and SD terminals, with the bottomgate as the control. Diode D is PN junction diode with the topgate floating, and Diode E is a PN junction diode with its topgate tied to its bottomgate.

The Flexfet™ technology developed by American Semiconductor, Inc. produces Flexible FET devices that are available as Flexfet™ transistors. These are planar IDG devices that have their topgate self-aligned to an ion-implanted bottomgate, specifically a silicon JFET bottomgate. The two self-aligned, independent gates control a single fully-depleted channel that is sandwiched between them. These independent top and bottom gates are contacted at opposite sides of the channel, which results in compact connections to all four transistor terminals (source, drain, topgate and bottomgate). The channel of this IDG transistor lies in the plane of the silicon wafer surface, similar to conventional CMOS single gate transistors, unlike those of the FinFET, Tri-gate, and other multi-gate transistors.

Figure 6:
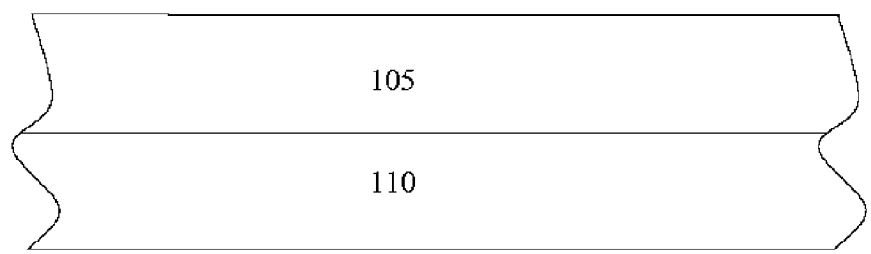
FIG. 6 shows a cross-section of a Silicon-On-Insulator (SOI) substrate.

The transistor of the present invention begins with a substrate 110, shown in FIG. 6, that may be formed of any number of suitable materials. The substrate 110 may include semiconductor materials, such as silicon, semi-insulators, such as gallium arsenide, and insulators such as sapphire and silicon dioxide, which is commonly referred to as a buried oxide (BOX) layer. The transistor also includes a semiconductor layer, one example of which is a Silicon-on-Insulator (SOI) layer 105. The SOI layer 105 may be formed by any number of available methods including SmartCut bonded, SIMOX, and so forth.

Figure 7A:
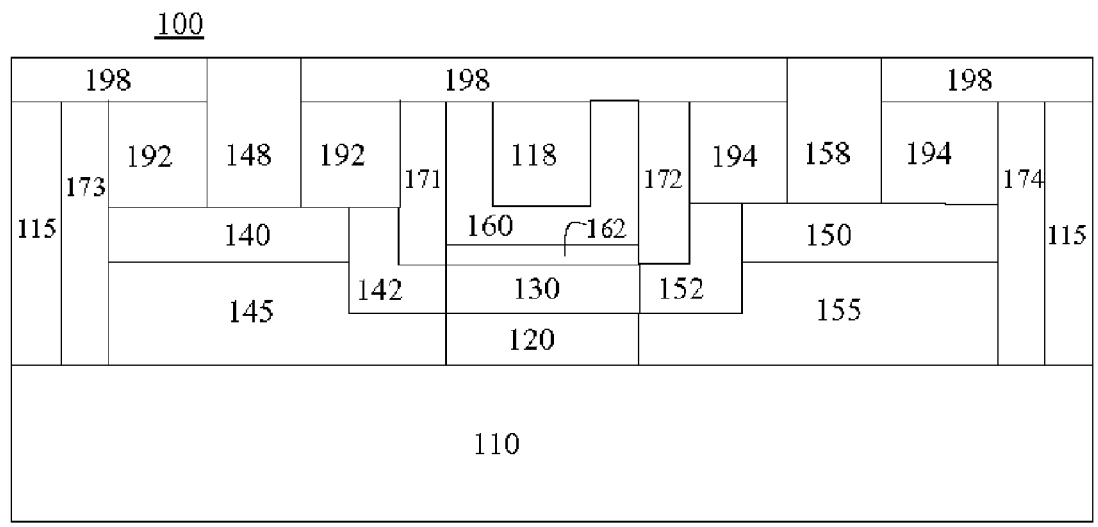
FIG. 7A is a cross-sectional channel length view of the preferred embodiment of a transistor of the present invention utilizing Doped Spacer Extensions.
Figure 7B:
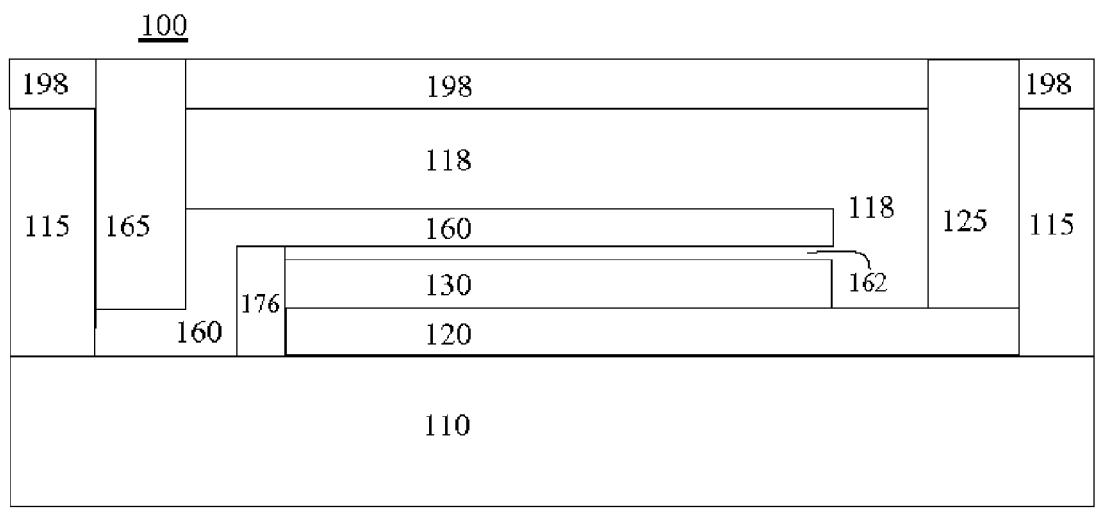
FIG. 7B is a cross-sectional channel width view of the transistor of FIG. 7A.

The discussion will now turn to FIGS. 7A and 7B which show the basic structure of the preferred embodiment of a transistor of the present invention in two views that are orthogonal to one another, respectively, along the channel length and the channel width. The transistor architecture of the present invention provides a four-terminal device that allows the source 140, drain 150, bottomgate 120, and topgate 160 to be biased independently. The bottomgate 120 and the topgate 160 may be wired out to the left or right based on design constraints. Additional conducting and dielectric layers may be disposed on the transistor 100 based on design configurations.

The Flexible Field Effect Transistor 100 illustrated here is an N-channel device, but may as well be embodied as a P-channel device, as can be appreciated by one of skill in the art. A junction-isolated bottomgate 120 of a low resistance doped semiconductor material is disposed on the Buried Oxide (BOX) 110. The bottomgate 120 is highly doped, such as by ion implantation, to create a P+ bottomgate 120 in the N-channel configuration. The source 140, drain 150, and channel 130 form a current flow path in accordance with FET practice. The source 140 and drain 150 may be formed of any suitable N+ materials in an N-channel configuration. Formation of the source 140 and drain 150 may include deposition of an additional material layer or doping of the existing dielectric layer 105.

The channel 130 may include a layer of material that is the same as the source 140 and drain 150, such as an N-type material in the example shown here, or opposite to the source and drain, or undoped. Application of a positive gate voltage attracts the mobile electrons in the N-type source 140 and drain 150 to form a channel 130. In FIG. 7A, the channel 130 is defined as the area between the source 140 with its source extension 142, drain 150 with its extension 152, bottomgate 120, and topgate 160. The channel 130 may be an undoped region. As can be appreciated, the present invention is applicable to either depletion or enhancement or accumulation type FETs.

In a typical inversion-mode MOSFET the channel operates from depletion (the Off-state) to inversion (the On-state), requiring that the channel be doped oppositely from the Source/Drain regions. For example, an inversion-mode NMOSFET has a p-type channel. The surface carrier layer must always be the same type as the Source/Drain. In the case of an NMOSFET, that layer is composed of electrons and is called an "inversion-layer" since it is inverted with respect to the majority holes in the P-type channel region.

On the other hand, the channel of an accumulation-mode MOSFET operates from depletion (the Off-state) to accumulation (the On-state), requiring the channel to be doped the same type as the Source/Drain regions. An accumulation-mode NMOSFET has an n-type channel, with an electron surface layer referred to as an "accumulation-layer." The transistor has no p-n junction isolation between the Source/Drain and the channel. This relaxes the need for abrupt SD to channel junctions.

Current conduction through an accumulation-mode device is resistive, similar to that in a JFET or a MESFET, and the resistance of the channel is modulated by its top and bottom gates. Usually the workfunctions of these gates and the thickness of the silicon channel are chosen to insure that the channel is fully depleted, that is, Off, when the gates are in their quiescent bias state. This device also has the advantage that its channel conduction layer is located within the silicon film, adjacent to neither the top nor the bottom gate interfaces. This improves the mobility of the carriers and reduces flicker (commonly referred to as 1/f) noise associated with defects at these gate interfaces. The transistor of the present invention uses a topgate workfunction to achieve proper threshold voltages for accumulation-mode devices, namely, N-FET positive, P-FET negative. It also uses a bottom JFET gate instead of another accumulation-mode MOSFET gate.

A topgate 160 may be disposed directly on the channel 130 with or without the use of a topgate dielectric 162 layer. When the topgate dielectric 162 is present, a MOSFET is formed using polysilicon, metal or a metal-like material for the topgate 160. Without the use of a topgate dielectric 162, the topgate 160 may be formed of a metal or any suitable metallic material, such as but not limited to Pt, W, Al, or TiN with a suitable workfunction for a MESFET, or a doped material for a JFET. A local interconnect 165 may or may not be disposed on the topgate 160 and may include any number of various materials such as Aluminum, TiN, Ti, W, and Polysilicon.

The transistor 100 as shown here consists of an implanted silicon JFET bottomgate 120 which is self-aligned to a topgate 160. This structure provides a junction-isolated bottomgate in the thin silicon layer above, not in, the Buried Oxide (BOX) 110, and therefore does not require formation of a bottomgate metal or a bottomgate oxide. This approach, while providing a bottomgate structure that is simpler than other designs, also avoids the need to bury this structure beneath a crystalline silicon channel which would require a means of low-temperature epitaxial growth. The crystallinity of the channel is preserved through thermal annealing following an ion implant of the bottomgate 120 through the channel 130 region, guaranteeing the self-alignment of the two gates. The top 160 and bottom 120 gates are perfectly centered over each other, without the need for a careful mask alignment. A further advantage of this approach is that the top 160 and bottom 120 gates may be deliberately formed with lengths that differ one from the other, thus providing the opportunity to tune the overlap or underlap distance for optimization of series resistance versus speed, and of DC-current versus AC-capacitance. This intentional offset is accomplished by varying the thickness of sidewall spacers (171 and 172), which will be addressed later.

The transistor 100 further includes polish stop pad layers 192 and 194 that are disposed on the source 140 and drain 150, respectively. The pad layers 192 and 194 are formed of a dielectric material. Extending through each pad layer 192 and 194 are one or more contact layers 148 and 158 that couple to a respective source 140 and drain 150.

First and second spacers 171, 172 are disposed in a trench between the polish stop pad layers (192 and 194, respectively) and the topgate 160 to prevent contact between the topgate 160 and the source 140 and drain 150 as shown. The spacers may include any number of insulating materials such as silicon nitride or silicon oxide. The spacers 171 and 172 further extend to prevent contact between the local interconnect 165 and the source 140 and drain 150.

As illustrated, the majority of the source 140 and drain 150 is disposed on one side of a corresponding spacer (171, 172) away from the channel 130. The source 140 and drain 150 extend, through appropriately doped spacer extensions 142 and 152 respectively, to the channel 130. This structure is distinguished by its SD junctions being shallower than the SOI film thickness, and by the formation of SD extensions at the lower left (Source, 142) and lower right (Drain, 152) corners of the gate trench by disposable doped glass sidewall spacers. These thick, effectively raised, SD regions of transistor 100 provide for low resistance and achieve high performance without the use of expensive selective silicon epitaxy as is required in fully-depleted SOI CMOS transistors produced by other means. The structure may be referred to as a Doped Spacer Extension device.

The disposition of the spacers 171, 172 and the extension of the source and drain (142 and 152) shield the channel 130 from the field effect of the source 140 and drain 150 while still providing contact to enable electron flow. As transistor size is reduced, the source and drain voltages interfere with the gate voltage and inhibit gate control of the channel 130. The present invention provides improved gate control of the channel 130 by limiting the field effect and capacitance of drain 150 voltages.

The transistor 100 further includes third and fourth spacers (173, 174) formed of the same insulating material of the first and second spacers (171, 172). The third and fourth spacers (173, 174) extend vertically along the peripheral edges of the transistor 100. The spacers 173 and 174 serve to isolate multiple instances of the transistors 100 from each other and to provide radiation resistance; these may be referred to as exterior spacers. As can be appreciated, the spacers 173 and 174 may extend, alone or in conjunction with other spacers, to surround the components of the transistor 100. An insulating layer 115, such as a STI (Shallow Trench Isolation) oxide, may further be disposed around the transistor 100 to provide further isolation. The transistor 100 is encapsulated within the insulating layer 115, spacers 173 and 174, and the InterLevel Dielectric (ILD) layer 198 to optimize performance.

Reference will now be made to FIG. 7B, a cross-sectional view of the channel width of transistor 100. The transistor 100 is a four terminal, double-gated device with each gate having an independent bias. The substrate 110, bottomgate 120, channel 130, topgate 160, topgate contact 165 and ILD layer 198 are shown vertically disposed relative to one another. Further shown is a second local interconnect 125 that contacts the bottomgate 120 and provides an independent bias to the bottomgate 120. The second local interconnect 125 is the same material as the first local interconnect 165. The local interconnects 165 and 125 together provide the local interconnect for the top and bottom gates, 160 and 120.

The second local interconnect 125 is separated from the first local interconnect 165 by an STI insulator 118. The insulator 118 may be formed of any suitable material such as an oxide or nitride. In this manner, the topgate 160 and the bottomgate 120 are independently biased. As shown, the topgate 160 is offset relative to the bottomgate 120 to enable separate bias. The offset is accomplished by appropriately positioning the topgate mask along the x-axis during the manufacture process.

Spacers are disposed adjacent to the bottomgate 120 to insulate it as needed. In the four-terminal device, the spacer 176 separates the bottomgate 120 and the channel 130 from the first local interconnect 165 to the topgate 160.

Figure 8A:
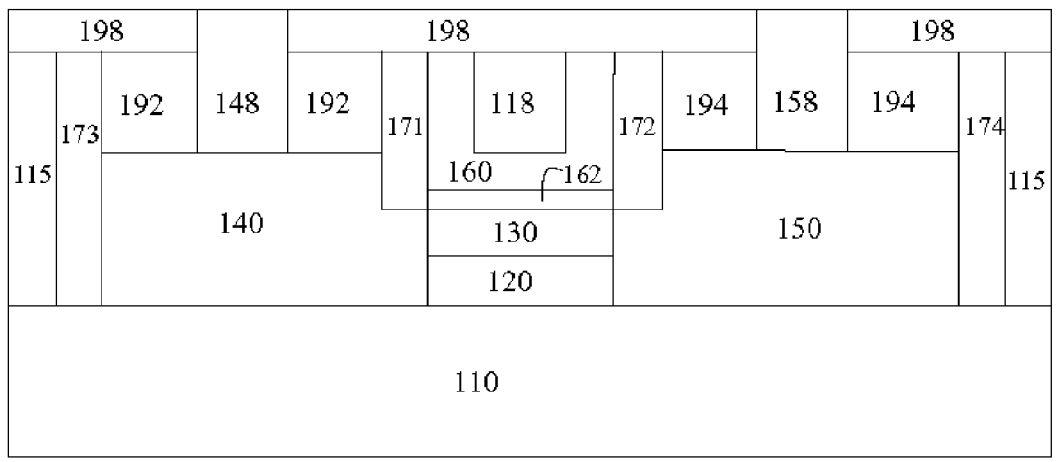
FIG. 8A is a cross-sectional channel length view of an alternate embodiment of a transistor of the present invention having Laterally Diffused Extensions (LDE)
Figure 8B:
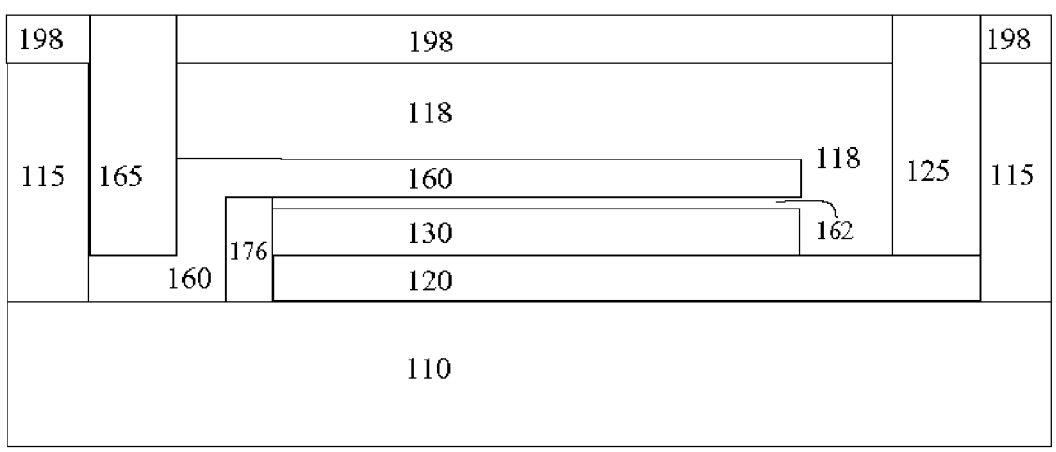
FIG. 8B is a cross-sectional channel width view of the transistor of FIG. 8A.

FIGS. 8A and 8B show an alternate embodiment to the transistor 100 of FIGS. 7A and 7B described above. The notable difference here is the absence of extensions. The source 140 and drain 150 of this device are laterally diffused to extend all the way to the channel 130 and to the BOX 110. The source 140 here includes the entire volume that was formerly occupied by not just the source 140 itself but also the source extension 142. Similarly, the drain 150 of this device also incorporates the former drain extension 152 (of FIG. 7A). Though this structure may be identified by its Laterally Diffused Extensions, the extensions are not explicit but appear as artifacts of lateral diffusion.

Figure 9A:
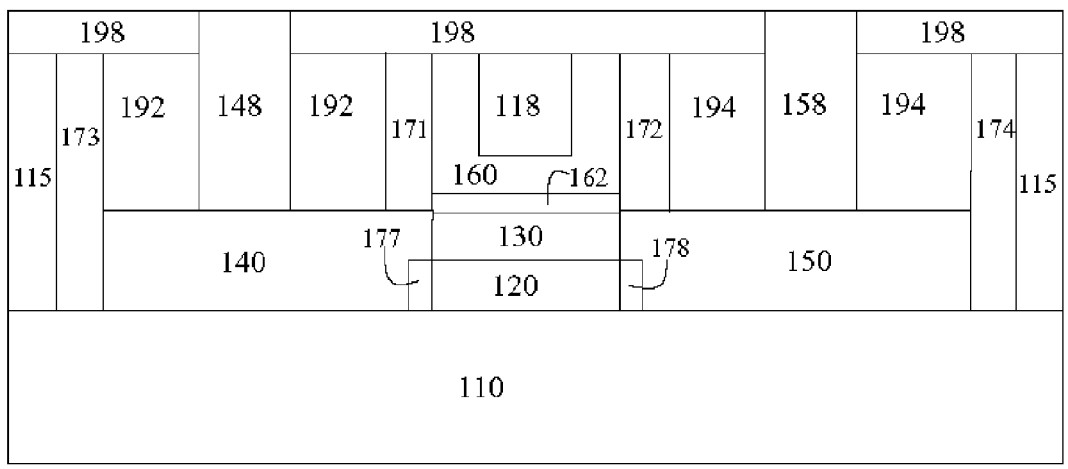
FIG. 9A is a cross-section channel length view of an alternate embodiment of a transistor of the present invention incorporating a buried silicide.
Figure 9B:
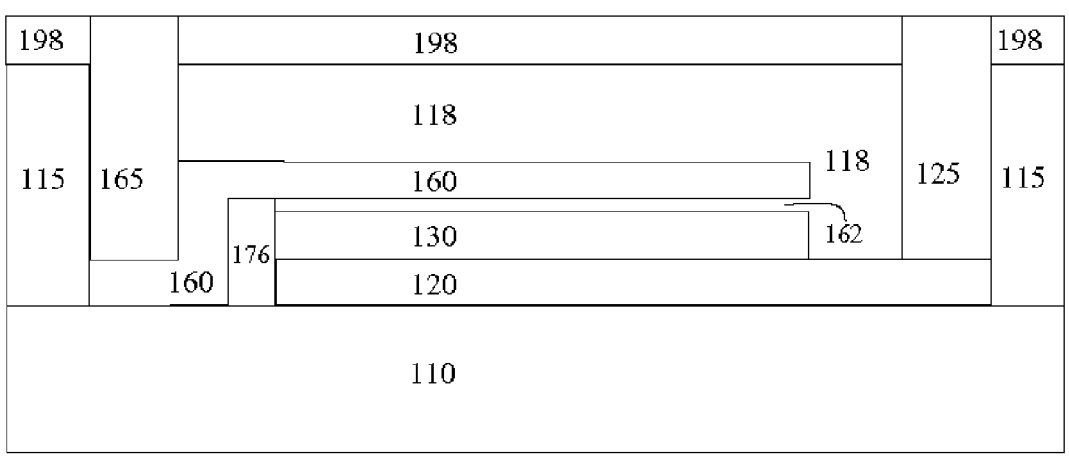
FIG. 9B is a cross-sectional channel width view of the transistor of FIG. 9A.

An alternate embodiment of the presently invented transistor shown in FIGS. 9A and 9B applies Buried Silicide to the Source 140 and the Drain 150. This device includes a self-aligned metal silicide in all Source/Drain regions extending down to the BOX 110. As shown, the silicide is formed over the entire surface of the SD regions, buried under a dielectric layer instead of being used only in the contact holes, resulting in improved SD resistance. Insulating sidewall spacers 177 and 178 separate the SD silicide from the bottomgate 120. The use of this Buried Silicide is applicable to each of the devices shown as the Doped Spacer Extension version in FIG. 7 and the Laterally Diffused Extension device of FIG. 8. In general, silicide may be used on, or in place of, all of the SD regions of the transistor 100, but not in direct contact with the bottomgate 120.

Figure 10A:
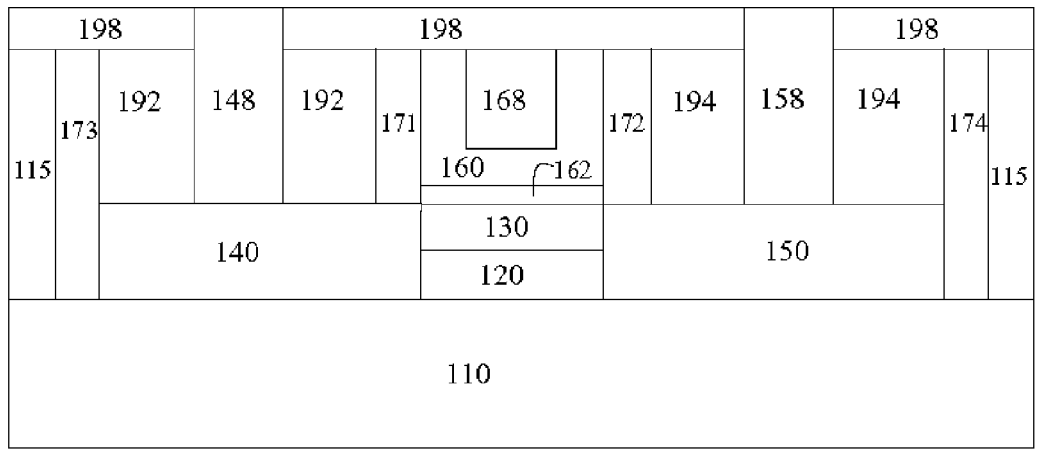
FIG. 10A is a cross-section channel length view of an alternate embodiment of a transistor of the present invention having a Damascene Topgate which may be implemented with (as shown) or without silicide.
Figure 10B:
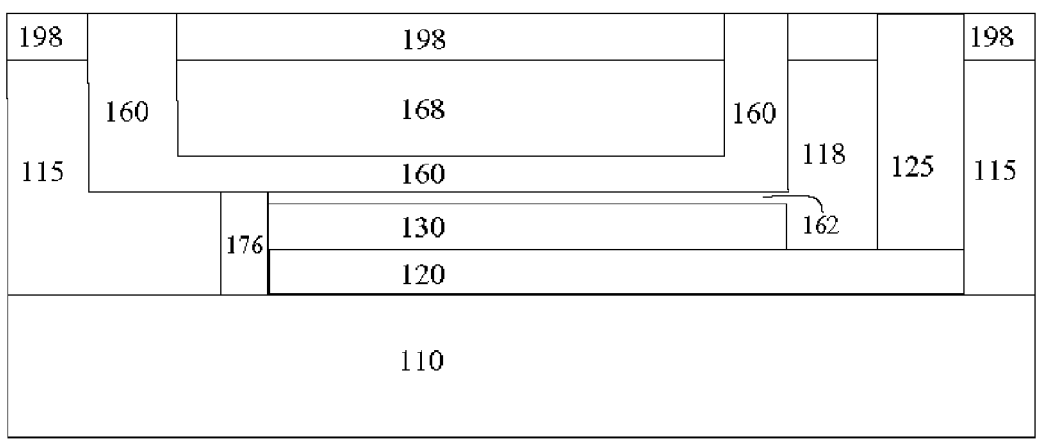
FIG. 10B is a cross-sectional channel width view of the transistor of FIG. 10A.

FIGS. 10A and 10B show an alternate embodiment having a Damascene Topgate 168. The Damascene structural characteristics may be incorporated into each of the previously described embodiments, including the Doped Spacer Extension of FIG. 7, the Laterally Diffused Extension of FIG. 8, and their variations that incorporate the silicide of FIGS. 9A and 9B. In this structure, the same metal (such as tungsten) fills both the topgate and local interconnect trenches, resulting in a lower topgate resistance.

A further advantage of the present invention in all of its embodiments is its inherent radiation hardness. To limit radiation sensitivity, the bottomgate 120 is used to provide tolerance to charge accumulation in underlying materials. Radiation will tend to accumulate within an oxide such as in a buried oxide of the substrate 110. The bottomgate 120 mitigates SOI total ionizing dose (TID) radiation sensitivity by forming a blockade to radiation induced accumulation of positive charge along the BOX 110 interface with the Source/Drain (140, 150) silicon, thus preventing leakage currents from Drain 140 to Source 150. In the embodiment of the transistor 100, shown in FIGS. 8A and 8B, the only volume of silicon that is depleted at any time is the ultra-thin channel 130. This tiny depletion volume further mitigates the sensitivity of the presently designed transistor 100 to single event (SEE) ionizing radiation effects. Susceptibility to SEE can be further reduced by applying an appropriate bias voltage to the bottom gate. The resultant transistor 100 is therefore tolerant of extreme space environments, i.e. radiation, and both cryogenic and high temperatures.

Each of the device structures shown above may be used in any application that would benefit from the characteristics of an IDG FET. In addition to those applications already described, the various forms of transistor 100 disclosed here may be applied to digital logic where gate density can be improved by replacing every two parallel transistors with only one IDG transistor. Also, single transistor transmission, or passgates, can be achieved, as well as single transistor mixers. Superior density and performance of embedded memory cells are possible with the presently disclosed IDG CMOS technology. The buried channel and lack of bottomgate oxide in transistor 100 enable construction of RF-capable CMOS integrated circuits demonstrating excellent low-noise and highly linear behavior. Also, high-Q inductors, MIM capacitors and excellent digital-to-analog decoupling are achieved by the high-resistivity SOI substrate. The totally planar 4-terminal layout described here permits the mapping of existing bulk CMOS circuit designs into this double-gate process without the complex interconnections required by other designs. Furthermore, the structure of the presently disclosed transistor is scalable to below the 32 nm node of the ITRS (International Technology Roadmap for Semiconductors).

The use of IDG FETs is also highly desirable for ultra-low-power (ULP) circuit designs due to the fact that the independent double gates offer dynamically reconfigurable devices, by using the bottomgates to shift threshold voltages. By varying the bottomgate voltage of an IDG MOSFET, the standby leakage and power dissipation can be dynamically changed over several orders of magnitude, while the switching speed and operating frequency can be traded off directly against the active power dissipation. Therefore, minimum sized transistors can be used to achieve ULP when biased into a standby condition, and then re-biased to a high-performance (HP) active mode. This advantage holds for analog circuitry in addition to both static and dynamic CMOS logic gate families.

Figure 11:
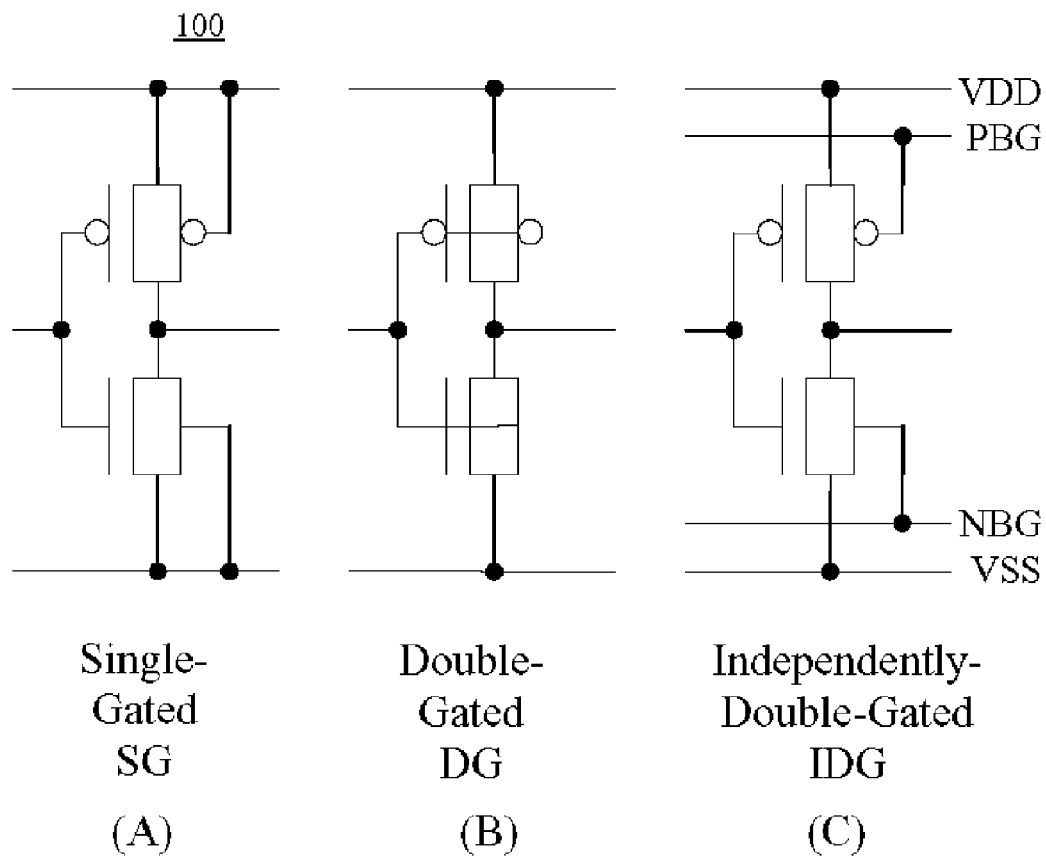
FIGS. 11A-11C shows various configurations of CMOS inverters utilizing transistors constructed within the present invention, respectively, (A) Single Gate (SG), (B) Double-Gate (DG), and (C) Independently-Double-Gated (IDG)
Figure 12:
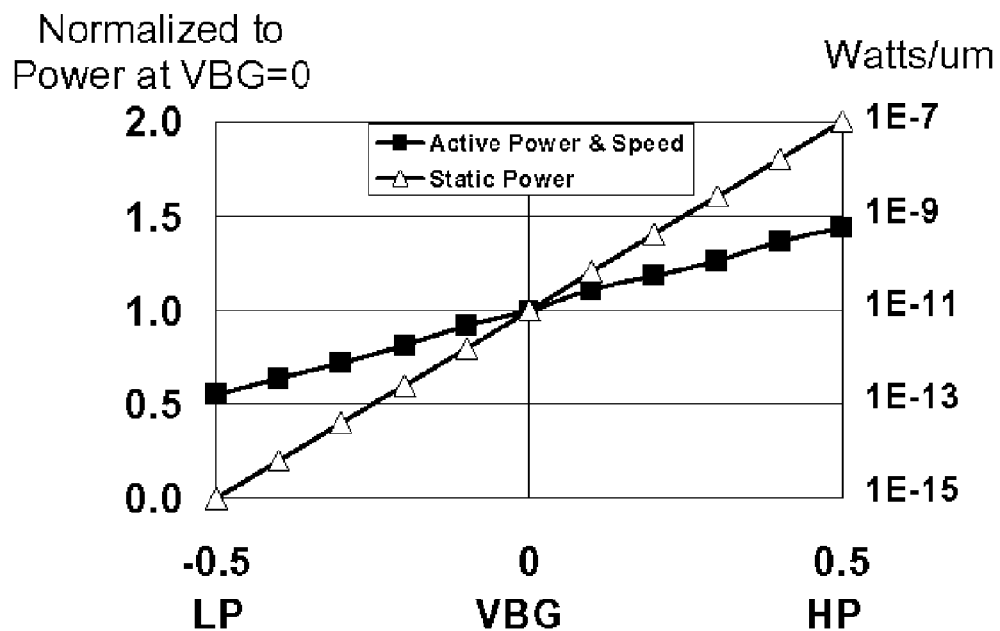
FIG. 12 is a graphical plot of data samples showing the active power versus switching delay as a function of the voltage applied to the Bottomgate of each transistor in the IDG CMOS inverter of FIG. 9C.

Examples of CMOS inverters are shown in FIG. 11, where each of the transistors of FIGS. 2-4 have been used respectively for the SG stage of FIG. 11A, the DG in FIG. 11B, and the IDG in FIG. 11C. A plot showing the high degree of dynamic threshold control afforded by the presently described IDG FET is shown in FIG. 12. It is to be noted here that a voltage swing of only one volt at the bottomgate, from VBG of −0.5V to +0.5V, is required to switch between low power (LP) and high performance (HP) modes of operation. FIG. 12 shows the tradeoff that is possible between active power versus delay (the inverse of speed) and the static power range possible simply by adjusting the bottomgate voltage VBG of each transistor.

While it is possible to provide one independent bottomgate control line for each individual transistor in an integrated circuit, it may be more desirable to group several transistors together with one shared bottomgate, similar to what is often done in a bulk CMOS well. For example, the bottomgates of all PMOS transistors in a circuit can be tied together to a signal named PBG (FIG. 11C), while the bottomgates of all of the NMOS transistors are tied together to a signal called NBG. This is superior to bulk CMOS because neither NBG nor PBG are connected to the substrate and thus to ground.

Figure 13:
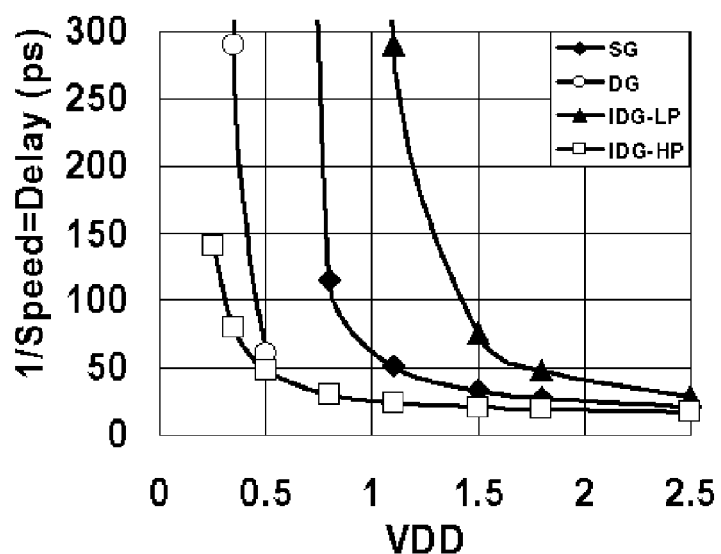
FIG. 13 shows the inverter gate delay of SG, DG, low power IDG, and high performance IDG, as a function of power supply voltage VDD for a 180 nm IDG CMOS technology.

FIG. 13 shows the gate delays of inverters constructed and operated as (FIG. 11) SG, DG, low power IDG, and high performance IDG, as a function of power supply voltage VDD for a 180 nm IDG CMOS technology. The slowest, lowest power, condition occurs when both NBG and PBG bottomgates are biased into their Off state at −0.5V, while the fastest, highest power, condition occurs when both bottomgates are held On at +0.5V. As can be seen in FIG. 13, the SG inverter gate fails below VDD=1.5V, and the DG inverter gate fails below 0.5V. However, the IDG inverter gate works well over a wide VDD range, with the high performance condition (VBG=+0.5V) working down to VDD=0.25V. Essentially all static and dynamic digital circuits, as well as analog, mixed-signal and RF circuits can benefit from Independently-Double-Gated (IDG) operation.

The present invention provides a unique transistor architecture that greatly improves gate control of the channel. The improved gate control is achieved in various embodiments by providing direct control of the channel through elimination of a dielectric film between the channel and the gates. The resulting electron flow path has high mobility and high current drive. The transistor architecture is flexible and may be configured with different terminal connections for different electrical behavior. It will be obvious to those having skill in the art that many changes may be made to the details of the above-described embodiments without departing from the underlying principles of the invention. It will also be appreciated by persons skilled in the related arts that these new transistors open myriad possibilities for circuit designs. The scope of the present invention should, therefore, be determined only by the following claims.

What is claimed is:
1. A field effect transistor, comprising:
  a substrate;
  a substrate dielectric disposed on the substrate;
  a bottom gate disposed on the substrate dielectric;
  a source disposed above the substrate dielectric and having
    a source extension extending from a main body of the
    source to be adjacent to the bottom gate;

a drain disposed above the substrate dielectric and having a drain extension extending from a main body of the drain to be adjacent to the bottom gate;
a channel confined by being coupled between the source extension and the drain extension, the channel making a junction contact to the bottom gate to form a JFET;
a top gate disposed above the channel;
a local interconnect coupled to the top gate;
a first insulating spacer disposed between the top gate and the source; and
a second insulating spacer disposed between the top gate and the drain.

2. The transistor of claim 1, wherein the top gate comprises a semiconductor or polysemiconductor material, such as silicon or polysilicon, to form a top gate JFET.

3. The transistor of claim 1, wherein the top gate comprises metal or a metal-like material to form a top gate MESFET.

4. The transistor of claim 1, further comprising:
a gate dielectric disposed between the channel and the top gate, and
wherein the top gate comprises polysilicon, metal or a metal-like material to form a top gate MOSFET.

5. The transistor of claim 1, wherein the
local interconnect coupled to the top gate is a first local interconnect and is disposed between the first and second insulating spacers, and
said transistor further comprises:
a second local interconnect insulated from the first local interconnect and coupled to the bottom gate to provide independent bias to the bottom gate.

6. The transistor of claim 1, wherein the local interconnect coupled to the top gate is insulated from the bottom gate.

7. The transistor of claim 1, wherein the local interconnect coupled to the top gate for control of an upper portion of the device is further coupled to the bottom gate for control of the JFET portion of the device, whereby a three-terminal device is formed with a common bias being applied to the top gate and to the bottom gate.

8. The transistor of claim 1,
wherein the source and the drain and their extensions comprise buried silicide.

9. The transistor of claim 8,
wherein the buried silicide is self-aligned to the source and to the drain.

10. The transistor of claim 1, wherein the source and the drain may be on the substrate dielectric.

11. The transistor of claim 1, wherein the substrate dielectric is a semiconductor that is doped to provide isolation.

12. The transistor of claim 1, wherein the top gate is filled with the same material as the local interconnect, whereby a lower top gate resistance is achieved.

13. The transistor of claim 1, wherein the channel is undoped.

14. The transistor of claim 1, wherein the main body of the source and the main body of the drain are vertically disposed higher than the channel.

15. The transistor of claim 1, further comprising:
a local interconnect disposed on the top gate and between the first and second spacers;
a first pad disposed on the source;
a second pad disposed on the drain;
a first contact extending through the first pad and coupled to the source; and
a second contact extending through the second pad and coupled to the drain.

16. The transistor of claim 15, further comprising a plurality of exterior spacers disposed on the substrate and proximate to the dielectric layer, source, drain, and pads.

17. The transistor of claim 16, further comprising an insulator layer disposed on the substrate and coupled to the exterior spacers.

18. The transistor of claim 15 further comprising an interlayer dielectric (ILD) layer disposed on the first and second pads and wherein the first and second contacts extend through the ILD layer.

19. The transistor of claim 15, wherein the first pad and the second pad are nitride.

20. The transistor of claim 1 where the channel may be U-shaped.

21. The transistor of claim 1 wherein the channel is fully depleted.

22. The transistor of claim 1 wherein the channel material is suitably doped and of such thickness to form an accumulation mode device.

23. The transistor of claim 1,
wherein the source completely displaces the region occupied by the source extension, the source being confined by the first insulating spacer, the channel, the bottom gate, and the substrate dielectric, and
wherein the drain completely displaces the region occupied by the drain extension, the drain being confined by the second insulating spacer, the channel, the bottom gate, and the substrate dielectric.

24. The transistor of claim 1, wherein the bottom gate provides tolerance to total ionizing dose (TID) radiation effects by blocking the formation of a parasitic current leakage path.

25. The transistor of claim 1, wherein a bias voltage may be applied to the bottom gate to improve radiation tolerance to single event effects (SEE).

26. The transistor of claim 1, wherein
one and only one of the top gate or the bottom gate is left floating, or is connected to the source or to the drain, or the top gate and the bottom gate are connected to one another, whereby a three-terminal transistor is created.

27. The transistor of claim 1, further comprising:
a connection of the source to the drain; and
wherein one and only one of the top gate or the bottom gate is left floating, or is connected to the connection of the source to the drain, or the top gate and the bottom gate are connected to one another,
to create a capacitor having two terminals.

28. The transistor of claim 1, further comprising:
a connection of the source to the drain to create a three-terminal device,
whereby the top gate serves as the control input of a gated-diode between the bottom gate and a terminal attached to the connection of the source to the drain, or
whereby the bottom gate controls a variable capacitor (varactor) between the top gate and the terminal attached to the connection of the source to the drain.

29. The transistor of claim 1,
wherein one and only one of the top gate or the bottom gate is left floating and the other of the top gate or the bottom gate is connected to the drain, or
the top gate is connected to the drain and the bottom gate is connected to either the source or to the top gate,
to create a diode having two terminals.

* * * * *